United States Patent [19]
Lin

[11] Patent Number: 6,057,789
[45] Date of Patent: May 2, 2000

[54] RE-SYNCHRONIZATION OF INDEPENDENTLY-CLOCKED AUDIO STREAMS BY DYNAMICALLY SWITCHING AMONG 3 RATIOS FOR SAMPLING-RATE-CONVERSION

[75] Inventor: Tao Lin, Fremont, Calif.

[73] Assignee: NeoMagic Corp., Santa Clara, Calif.

[21] Appl. No.: 09/182,348

[22] Filed: Oct. 29, 1998

[51] Int. Cl.$^7$ ............................... H03M 7/00; G06F 7/10
[52] U.S. Cl. ........................................ 341/61; 364/724.01
[58] Field of Search .................... 341/61, 50; 364/724.1, 364/724.01

[56] References Cited

U.S. PATENT DOCUMENTS

| | | | |
|---|---|---|---|
| 4,020,332 | 4/1977 | Crochiere et al. | 235/152 |
| 4,612,568 | 9/1986 | Den Hollander et al. | 358/19 |
| 5,204,827 | 4/1993 | Fijita et al. | 364/724.1 |
| 5,274,372 | 12/1993 | Luthra et al. | 341/61 |
| 5,331,346 | 7/1994 | Shields et al. | 348/441 |
| 5,398,029 | 3/1995 | Toyama et al. | 341/61 |
| 5,592,588 | 1/1997 | Reekes et al. | 395/2.87 |
| 5,647,008 | 7/1997 | Farhangi et al. | 381/119 |
| 5,712,635 | 1/1998 | Wilson et al. | 341/144 |
| 5,768,311 | 6/1998 | Betts et al. | 375/222 |
| 5,907,295 | 5/1999 | Lin | 341/61 |

OTHER PUBLICATIONS

Smith and Gossett, "A Flexible Sampling–Rate Conversion Method", Proceedings of the Int'l Conf. on Acoustics, Speech, and Signal Processing, San Diego, vol. 2, (New York), pp. 19.4.1–19.4.2, IEEE Press, Mar. 1984.

*Primary Examiner*—Michael Tokar
*Assistant Examiner*—Peguy JeanPierre
*Attorney, Agent, or Firm*—Stuart T. Auvinen

[57] ABSTRACT

A sample-rate converter has a FIFO for buffering input samples. The FIFO is written with an input sample by an input clock synchronized to the input audio stream. The samples are read from the FIFO by a derived clock. The derived clock is generated from an output clock using a nominal ratio of Q/P. Read and write counters for the FIFO are compared. When the write counter is ahead of the read counter by exactly a target amount the derived clock is a ratio of Q/P of the output clock. When the write counter is ahead of the read counter by more than the target, the read rate is increased by accelerating the derived clock to a ratio of (Q+1)/P. When the write counter is ahead of the read counter by less than the target amount, the read rate is decreased by slowing the derived clock to a ratio of (Q−1)/P. An accumulator generates the derived clock by adding Q, Q+1, or Q−1 for each output-clock pulse. Each derived-clock pulse reduces the accumulator by P. The accumulator value is used to select one group of L coefficients in a set of P groups to apply to a convolution FIR filter that generates the output sample from L input samples stored from the FIFO in a shift register.

20 Claims, 8 Drawing Sheets

| F0 | F1 | Q | P |
|---|---|---|---|
| 11.025KHz | 48KHz | 147 | 640 |
| 22.050KHz | 48KHz | 294 | 640 |
| 44.100KHz | 48KHz | 588 | 640 |
| 8 KHz | 48KHz | 104 | 624 |
| 16 KHz | 48KHz | 208 | 624 |
| 24 KHz | 48KHz | 312 | 624 |
| 32 KHz | 48KHz | 416 | 624 |
| 48 KHz | 48KHz | 624 | 624 |

FIG. 7

RE-SYNCHRONIZATION OF INDEPENDENTLY-CLOCKED AUDIO STREAMS BY DYNAMICALLY SWITCHING AMONG 3 RATIOS FOR SAMPLING-RATE-CONVERSION

FIELD OF THE INVENTION

This invention relates to sample-rate conversion in audio systems, and more particularly to dynamically switching the conversion ratio to reduce noise.

BACKGROUND OF THE INVENTION

Inexpensive personal computers (PC's) commonly use digital-audio systems. Audio inputs may be sampled at a rate of 11.025, 22.05, or 44.1 KHz, or at rates of 8, 16, 32, or 48 KHz. These audio samples are often stored and altered in a PC before being played back, often at a different rate.

It may be desired to play back an audio sample at a different rate, or to mix audio samples having different sample rates. One of the audio samples must be converted to the sample rate of the other audio sample for mixing or playback to occur. Sample-rate conversion software or hardware is used to convert the sample rate.

While many approaches to sample-rate conversion are used, satisfactory results are not always achieved. The human ear is quite sensitive to slight distortions or discontinuities of a sound. Coarse sample-rate conversion produces noticeable distortion.

A particular problem occurs when audio streams are synchronized to independent free-running clocks. The clocks for the two audio streams may be generated from two different crystal oscillators. Even when the frequencies are the same, slight differences can occur between the two crystals. The frequency difference may be up to 1000 parts-per-million (ppm). For a nominal 11,025 Hz sample rate, the frequency can be as high as 11025+11.025 or 11036 Hz. When a 11036 Hz audio signal synchronized to one crystal oscillator is converted to a 11025 Hz rate, audio samples may be deleted after every thousand or so samples. Deleting audio samples can cause audible clicks or pops.

Analog SRC—FIG. 1

FIG. 1 shows a prior-art sample-rate conversion using a pair of digital-analog converters. An input audio stream was sampled at frequency f0, and has samples $x(0), x(1), \ldots x(m)$. Each sample is a multi-bit binary number representing the intensity of the sound at a point in time; 16-bit binary numbers in two's complement are commonly used for each sample. The input sample at frequency f0 is to be converted to the output audio stream having a sample rate of f1, with samples $y(0), y(1), \ldots y(n)$. The number of sample points in the input stream, m, often differs from the number of samples in the output stream, n. The ratio of the number of samples, m/n, is equal to the frequency ratio f0/f1. The converted audio stream must have the same total play time, even though the number of samples increases or decreases and the rate of sample play back likewise increases of decreases.

The digital input samples $x(i)$ are converted to analog voltages on line 6 by digital-to-analog converter (DAC) 8. DAC 8 converts an input sample for each period of input clock 16, which operates at input frequency f0. The capacitance on line 6 maintains the voltage generated by DAC 8 until the next sample is converted.

The voltage on line 6 is sampled by analog-to-digital converter (ADC) 10, which generates a digital value representing the voltage sampled from line 6. This digital value is output as output sample $y(i)$. ADC 10 samples the voltage on line 6 for each period of output clock 15, which operates at output frequency f1.

While such an analog sample converter may be considered exact, since DAC 8 and ADC 10 operate from independent clocks 15, 16, it is complex and expensive. The analog circuits are difficult to integrate with other digital circuits on a VLSI integrated circuit (IC). Also, the quality of the digital audio stream is degraded by the multiple analog-digital conversions.

FIFO with SRC—FIGS. 2, 3

FIG. 2 illustrates using a FIFO to buffer a sample-rate converter. First-in-first-out FIFO 12 is written with an input audio sample $x(i)$ for each pulse of the input clock 16, which operates at input frequency f0. Sample-rate converter 14 is an all-digital converter that reads digital samples from FIFO 12 and outputs digital samples at the output frequency f1 in response to output clock 15. Sample-rate converter 14 generates derived clock 18 from output clock 15 by multiplying the output clock by Q and dividing by P. Thus derived clock 18 has a derived frequency f2 of $(Q/P)*f1$. Q and P are chosen so that f2 is about the same as input frequency f0. Thus FIFO 12 is read and written at about the same frequency.

When Q/P is not exactly the ratio of f0 to f1, FIFO 12 is read and written at slightly different rates. FIFO 12 can fill up or become empty. Samples can over-write earlier samples, or random or null data can be output as a sample. Thus simply using a FIFO can produce undesirable audio noise.

FIG. 3 shows using read and write pointers to control the FIFO buffering a sample-rate converter. Write counter 24 is clocked by input clock 16 while read counter 26 is clocked by derived clock 18. Thus write counter 24 keeps track of the write location in FIFO 12 while read counter 26 indicates the reading location in FIFO 12. Comparator 28 compares the values of write counter 24 and read counter 26 to determine when FIFO 12 is full or empty.

When write counter 24 matches read counter 26, FIFO 12 has become empty, and signal 30 causes FIFO 12 to continue to output the last audio sample, effectively duplicating an audio sample. When write counter 24 is ahead of read counter 26 by the size of FIFO 12, then comparator 28 detects that FIFO 12 is full. Input samples are prevented from being written into FIFO 12 until one or more samples have been read out to sample-rate converter 14. This essentially drops an audio sample.

Audible distortions can occur when FIFO 12 fills, since an input sample must be skipped rather than written to the full FIFO. When FIFO 12 becomes empty, a sample is missing and a previous sample may need to be duplicated, or a null or random sample output. While this is superior to simply allowing FIFO 12 to over-run or under-run, audible clicks or pops may still be discernable by the listener.

Phase Detector with SRC—FIG. 4

FIG. 4 highlights using a high-precision phase detector to alter the sampling ratio. This has been described by Julius O. Smith and Phil Gossett in "A Flexible Sampling-Rate-Conversion Method" at Stanford University. See also U.S. Pat. No. 5,398,029 by Toyama et al., and assigned to Nippon Precision Circuits Inc.

Sample-rate converter 14' is modified to vary the ratio Q/P in response to adjust signal 22 from phase detector 20. Phase detector 20 compares the instantaneous phase and frequency of input clock 16 to derived clock 18' generated by Sample-rate converter 14'. When the phase or frequency f0 varies from f2, phase detector 20 alters adjust signal 22. Sample-rate converter 14' responds to adjust signal 22 by increasing or decreasing the ratio Q/P, thus altering derived clock 18'. When derived clock 18' is adjusted sufficiently to match the phase and frequency of input clock 16, then adjust signal 22 stabilizes, causing sample-rate converter 14' to stop adjusting derived clock 18'. Changes in input clock 15 are thus tracked by sample-rate converter 14' in a similar manner to a Phase-locked loop (PLL).

Phase detector 20 is a high-precision detector running at a high frequency. Phase detector 20 must operate at a frequency at least 1000 times that of input frequency f0 so that phase changes of less than the clock period can be detected. Sample-rate converter 14' also needs a large memory for storing many sets of filter coefficients for the many possible ratios of Q/P.

What is desired is a digital sample-rate converter for common PC-audio sampling rates. It is desired to buffer digital-audio samples synchronized to independent clocks that may vary slightly in frequency. A digital sample-rate converter is desired that can eliminate audible clicks and pops caused by slight mismatches of sampling rates. A sample-rate converter with reduced coefficient storage is also desirable. High audio quality is desirable when samples from independent crystal oscillators are used.

SUMMARY OF THE INVENTION

A sample-rate converter has an input stream of samples representing audio intensities at points in time. The input stream plays the samples at an input rate of an input clock. An output stream of samples representing audio intensities at points in time is for playing the samples at an output rate of an output clock.

A buffer receives the samples from the input stream in response to the input clock. A derived-clock generator is coupled to the output clock. It generates a derived clock from the output clock. A filter stage is coupled to receive samples from the buffer in response to a derived clock. It converts samples read from the buffer at a derived rate of the derived clock to output samples output at the output rate.

A target indicator is coupled to the input clock and coupled to the derived clock. It indicates when the buffer contains a target number of samples, and when the buffer contains less than the target or more than the target number of samples. The derived-clock generator generates the derived clock with a nominal frequency when the target indicator indicates that the buffer contains the target number of samples. However, the derived-clock generator generates the derived clock with an accelerated frequency when the target indicator indicates that the buffer contains more than the target number of samples. Also, the derived-clock generator generates the derived clock with a slowed frequency when the target indicator indicates that the buffer contains less than the target number of samples. Thus the derived clock that reads the buffer is accelerated and slowed in response to a number of samples stored in the buffer.

In further aspects the buffer is a first-in-first-out FIFO. A conversion ratio of the input rate to the output rate is represented by Q/P. The nominal frequency is Q/P times the output rate. The accelerated frequency is (Q+x)/P times the output rate and the slowed frequency is (Q−x)/P times the output rate, where x is a small whole number while Q is a whole number greater than 100. Thus the conversion ratio is altered by the derived-clock generator to adjust sampling conversion.

In still further aspects the target indicator has a write counter coupled to the input clock. The write counter indicates a write modulo of a number of samples written to the FIFO. A read counter is coupled to the derived clock. It indicates a read modulo of a number of samples read from the FIFO. A comparator is for comparing a difference of the write modulo to the read modulo to the target number of samples. The comparator outputs an indication of when the FIFO contains a target number of samples, and when the FIFO contains less than the target or more than the target number of samples. Thus read and write counters are compared to adjust the conversion ratio.

In other aspects the derived-clock generator has an accumulator. The accumulator increases an accumulator value by a selected factor for each pulse of the output clock. The accumulator decreases the accumulator value by P for each pulse of the derived clock when the accumulator value reaches or exceeds P.

The selected factor is Q when the target indicator indicates that the FIFO contains the target number of samples. The selected factor is Q+x when the target indicator indicates that the FIFO contains more than the target number of samples, while the selected factor is Q−x when the target indicator indicates that the FIFO contains less than the target number of samples. Thus the accumulator generates the derived clock by adjusting the selected factor that increases the accumulator value from Q to Q+x or Q−x.

In other aspects the filter stage further has a shift register that is responsive to the derived clock and is coupled to receive samples read from the FIFO. It stores a plurality of L samples. A finite-impulse-response (FIR) filter is coupled to receive the plurality of L samples from the shift register. It generates an output sample for each pulse of the output clock by scaling each of the plurality of L samples by L coefficients to produce scaled samples. The scaled samples are summed to generate the output sample.

A coefficient storage is coupled to supply the L coefficients to the FIR filter. The coefficient storage stores P groups of L coefficients. Thus the plurality of L input samples from the FIFO are filtered to generate each output sample.

BRIEF DESCRIPTION OF THE DRAWINGS

FIG. 7 is a table of values for Q and P for typical audio-rate conversions.

DETAILED DESCRIPTION

The present invention relates to an improvement in digital sample-rate converters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a high-speed phase detector is undesirable and not necessary for sample-rate conversion. The number of sets of coefficients can be reduced to just one set since there are only three possible conditions of the read and write rates of the FIFO:

1. Read and Write rates match.
2. Read is faster than Write.
3. Read is slower than Write.

The read and write rates can match exactly, in which case the nominal Q/P ratio is correct. When the read rate exceeds the write rate, reading must be slowed. The derived clock is slowed by changing the clock ratio from Q/P to (Q−1)/P. The third condition is when the write rate exceeds the read rate. Then reading must be accelerated. The derived clock is then accelerated by changing the clock ratio from Q/P to (Q+1)/P.

The phase detector, which outputs a continuous range of adjustments, can be replaced with a simple comparator that compares the read and write counts rather than the clock edges (phases). The comparator can be a simple digital-logic circuit operating at relatively slow speeds.

Figure 1:
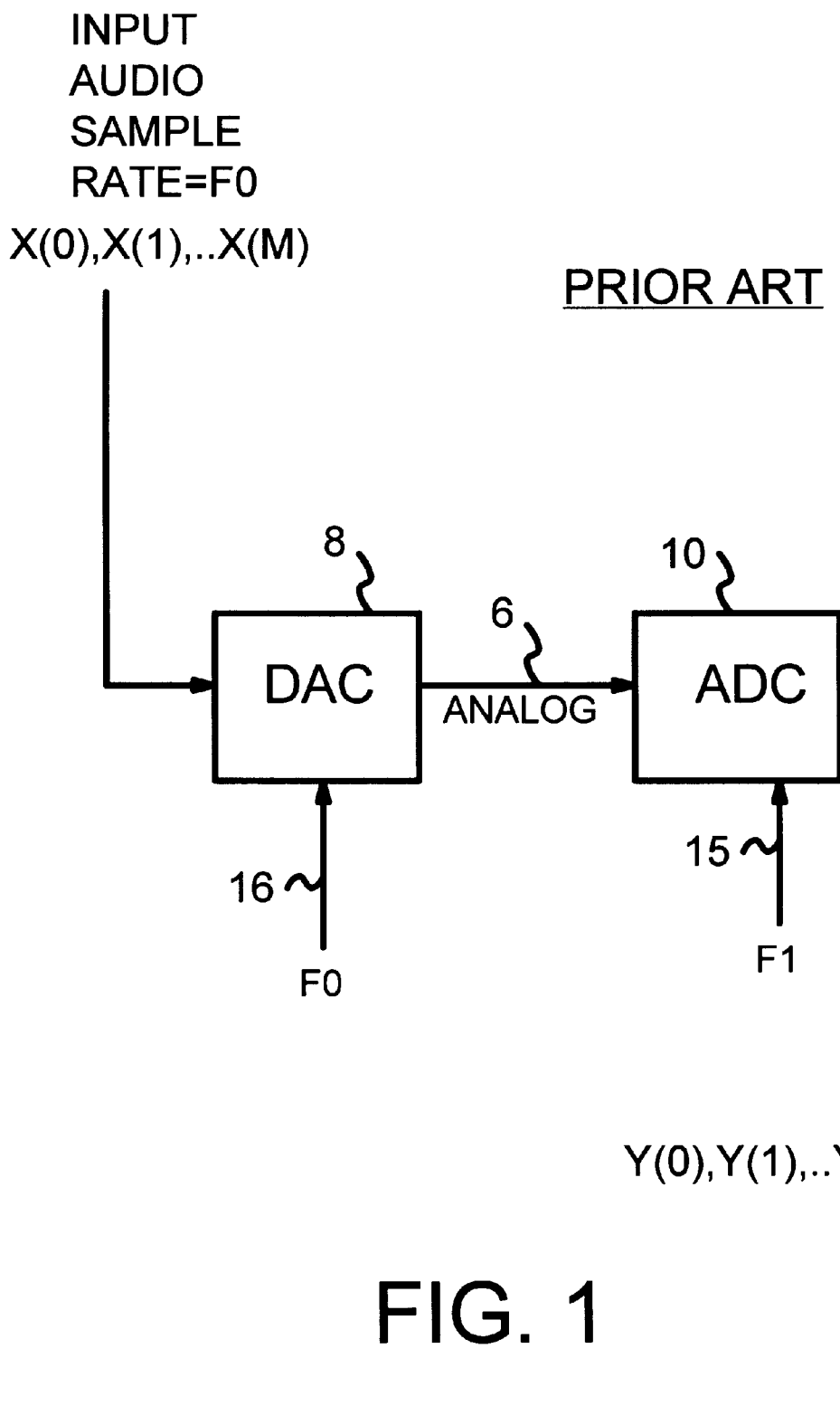
FIG. 1 shows a prior-art sample-rate conversion using a pair of digital-analog converters.
Figure 2:
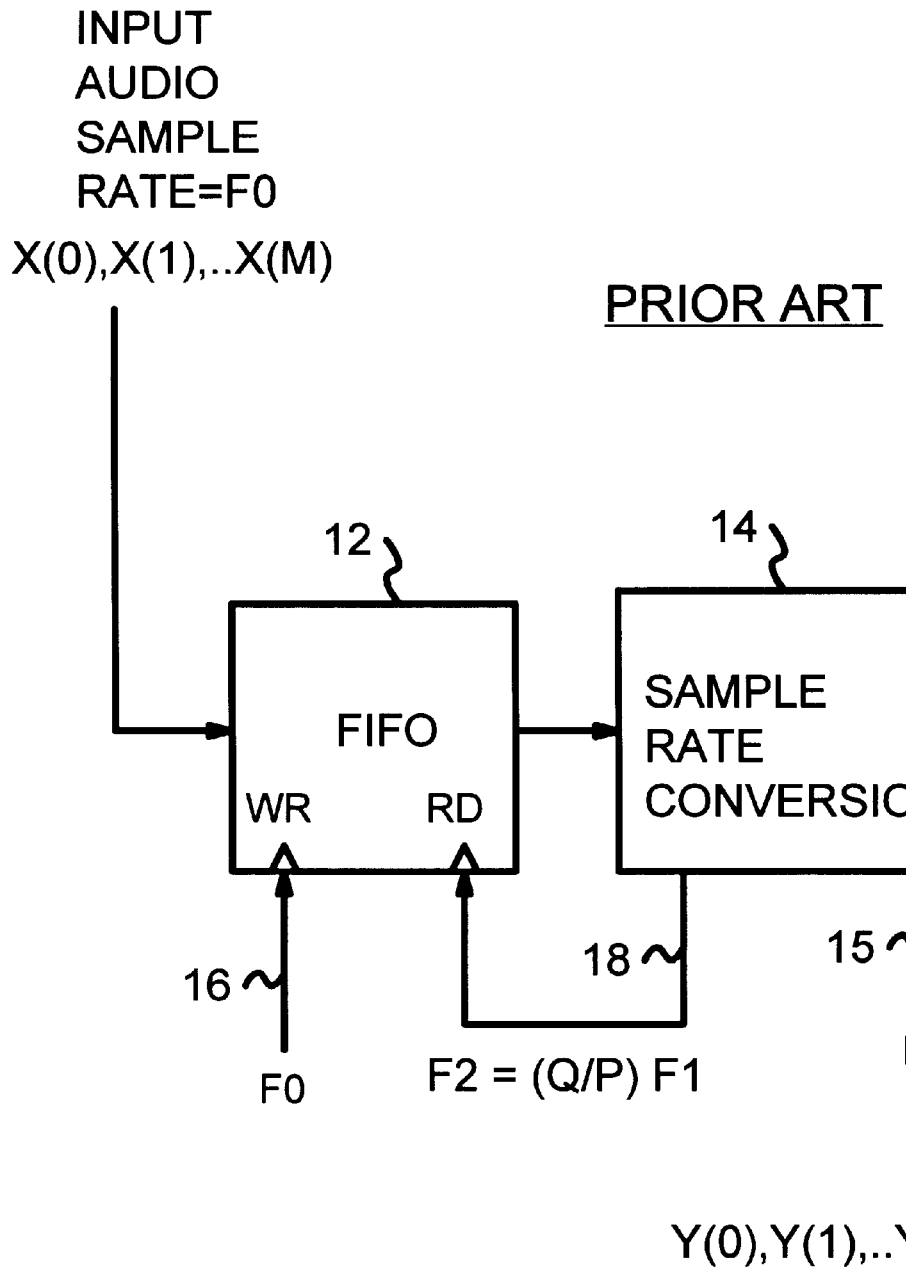
FIG. 2 illustrates using a FIFO to buffer a sample-rate converter.
Figure 3:
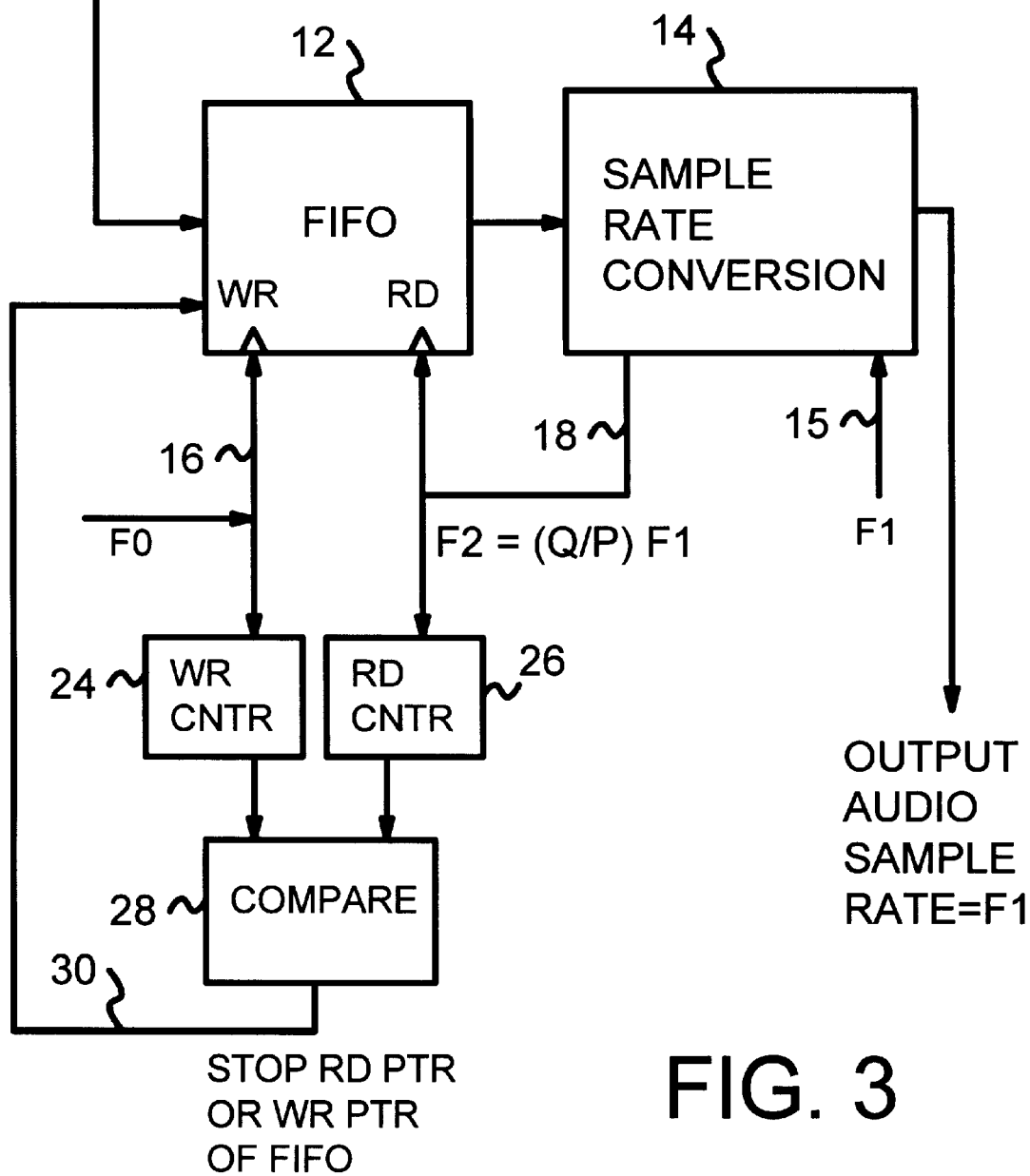
FIG. 3 shows using read and write pointers to control the FIFO buffering a sample-rate converter.
Figure 4:
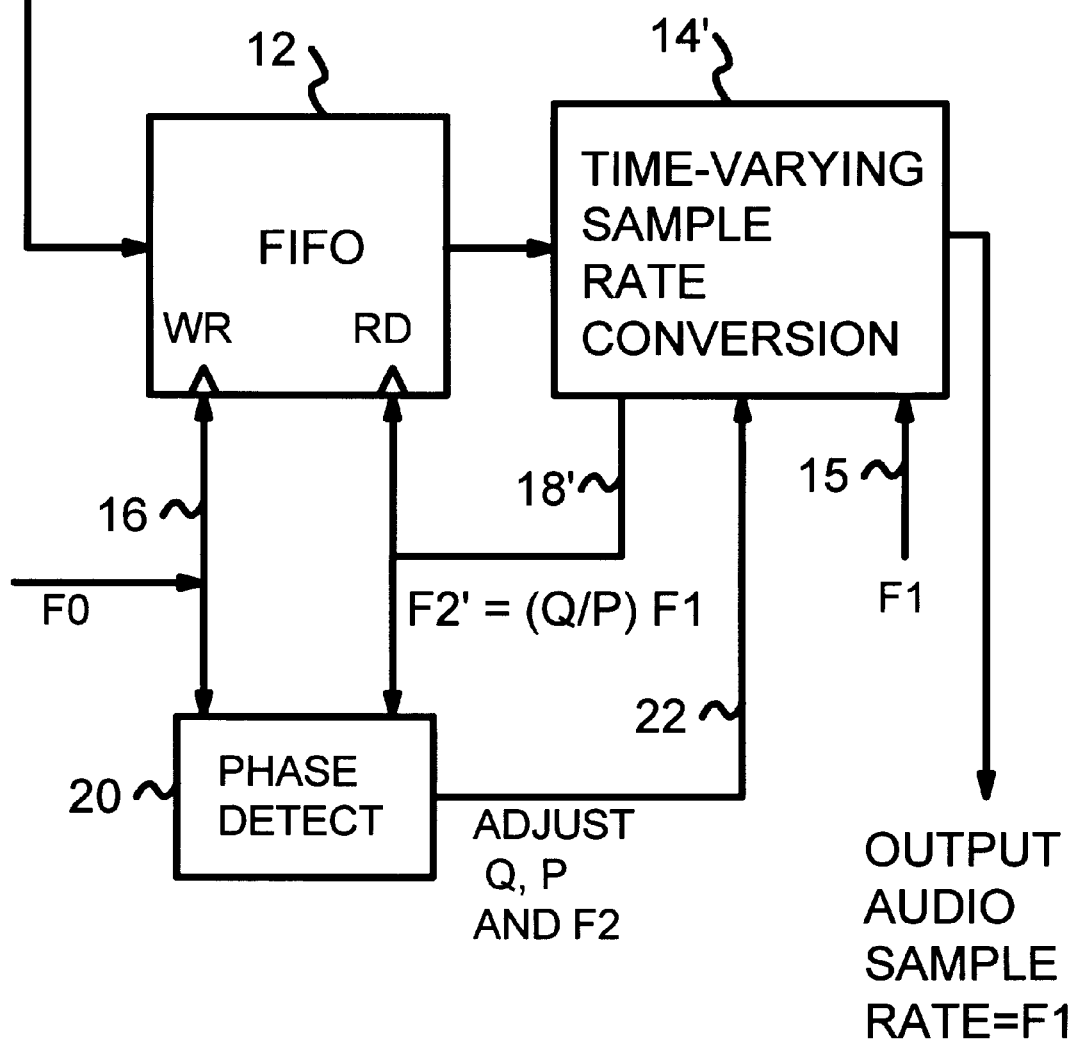
FIG. 4 highlights using a high-precision phase detector to alter the sampling ratio.
Figure 5:
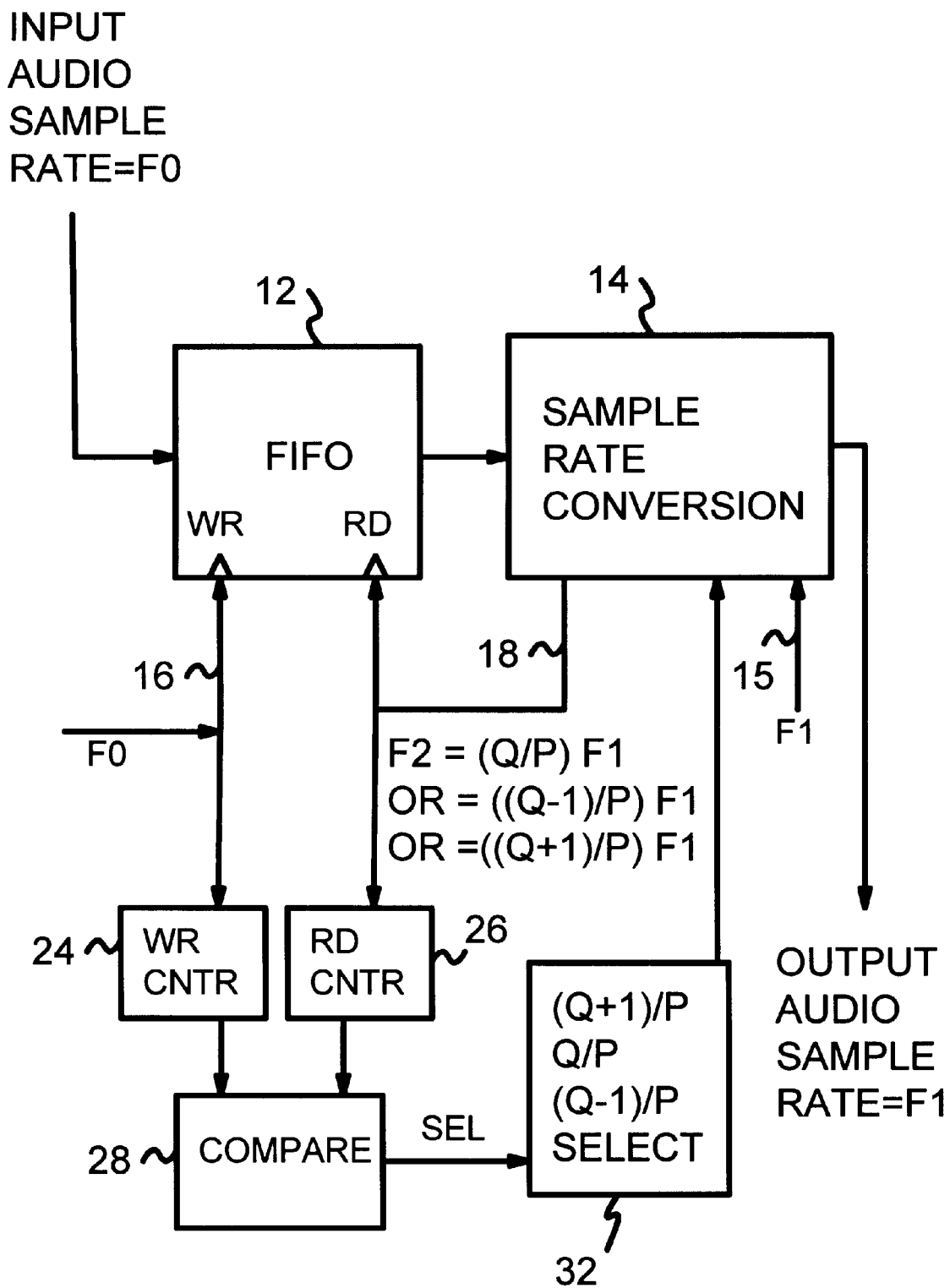
FIG. 5 shows a 3-ratio sample-rate converter buffered by a FIFO that selects one of the three ratios as a function of the read and write positions in the FIFO.

3-Ratio SRC—FIG. 5

FIG. 5 shows a 3-ratio sample-rate converter buffered by a FIFO that selects one of the three ratios as a function of the read and write positions in the FIFO. An input audio stream was sampled at frequency f0, and has samples $x(0)$, $x(1)$, $x(i) \ldots x(m)$. Each sample is a multi-bit binary number representing the intensity of the sound at a point in time; 16-bit binary numbers in two's complement are commonly used for each sample. The input sample at frequency f0 is to be converted to the output audio stream having a sample rate of f1, with samples $y(0)$, $y(1)$, $y(i) \ldots y(n)$. The number of sample points in the input stream, m, often differs from the number of samples in the output stream, n. The ratio of the number of samples, m/n, is equal to the frequency ratio f0/f1.

First-in-first-out FIFO 12 is written with an input audio sample $x(i)$ for each pulse of the input clock 16, which operates at input frequency f0. Sample-rate converter 14 is an all-digital converter that reads digital samples from FIFO 12 and outputs digital samples at the output frequency f1 in response to output clock 15.

Sample-rate converter 14 generates derived clock 18 from output clock 15 by multiplying the output clock by Q, Q+1, or Q−1 and dividing by P. Thus derived clock 18 has a derived frequency f2 of (Q/P)*f1, or ((Q+1)/P)*f1 or ((Q−1)/P)*f1. Q and P are chosen so that f2 is about the same as input frequency f0. FIFO 12 is therefore read and written at about the same frequency.

Write counter 24 is clocked by input clock 16 while read counter 26 is clocked by derived clock 18. Thus write counter 24 keeps track of the write location in FIFO 12 while read counter 26 indicates the reading location in FIFO 12. Comparator 28 compares the values of write counter 24 and read counter 26 to determine when FIFO 12 is filling or emptying.

Rather than determining when FIFO 12 is full, or when FIFO 12 is empty, comparator 28 compares the difference of the write and read pointers to a target. In a preferred embodiment the target is 2 for a 4-deep FIFO, so that the write location is two locations ahead of the read location. Other embodiments can use other targets, such as for larger FIFOs that are half-full.

When comparator 28 determines that write counter 24 is two ahead of read counter 26, FIFO 12 is on target. Comparator 28 signals selector 32 to use the nominal ratio Q/P, selecting filter coefficients for sample-rate converter 14 that produce a sampling ratio of Q/P. Derived clock 18 is then generated by sample-rate converter 14 at frequency f2=(Q/P)*f1.

When the input clock (frequency f0) is faster than the derived clock (frequency f2), FIFO 12 is read too slowly. Write counter 24 eventually becomes more than two locations ahead of read counter 26. Then comparator 28 detects that write counter 24 is three or more ahead of read counter 26 and signals selector 32 to use the accelerated sampling ratio (Q+1)/P. Selector 32 then selects filter coefficients for sample-rate converter 14 that produce a sampling ratio of (Q+1)/P. Derived clock 18 is then generated by sample-rate converter 14 at a higher frequency f2=((Q+1)/P)*f1.

Once the accelerated reading rate causes write counter 24 to again be just two locations ahead of read counter 26, comparator 28 signals selector 32 to switch back to the coefficients for nominal ratio Q/P. Derived clock 18 is again generated by sample-rate converter 14 at nominal frequency f2=(Q/P)*f1.

When the input clock (frequency f0) is slower than the derived clock (frequency f2), FIFO 12 is read too quickly. Write counter 24 eventually becomes less than two locations ahead of read counter 26. Then comparator 28 detects that write counter 24 is one or zero locations ahead of read counter 26 and signals selector 32 to use the slowed sampling ratio (Q−1)/P. Selector 32 then selects filter coefficients for sample-rate converter 14 that produce a sampling ratio of (Q−1)/P. Derived clock 18 is generated by sample-rate converter 14 at a lower frequency f2=((Q−1)/P)*f1.

The sampling ratio is thus adjusted slightly by the filter coefficients selected by selector 32 to keep FIFO 12 filled to the target of two samples. Only one set of filter coefficients is needed, rather than a wider range, since only three conditions can exist and the three conditions are filtered by the same set of filter coefficients.

The reading and writing rates must not vary by larger amounts, because increasing the ratio to (Q+1)/P must be sufficient for the read rate to catch up to the write rate. When crystal oscillators are guaranteed to match within 1000 ppm, switching to (Q+1)/P is sufficient. Lower-quality crystals may require that the Q/P ratio be adjusted to (Q+2)/P or more.

Figure 6:
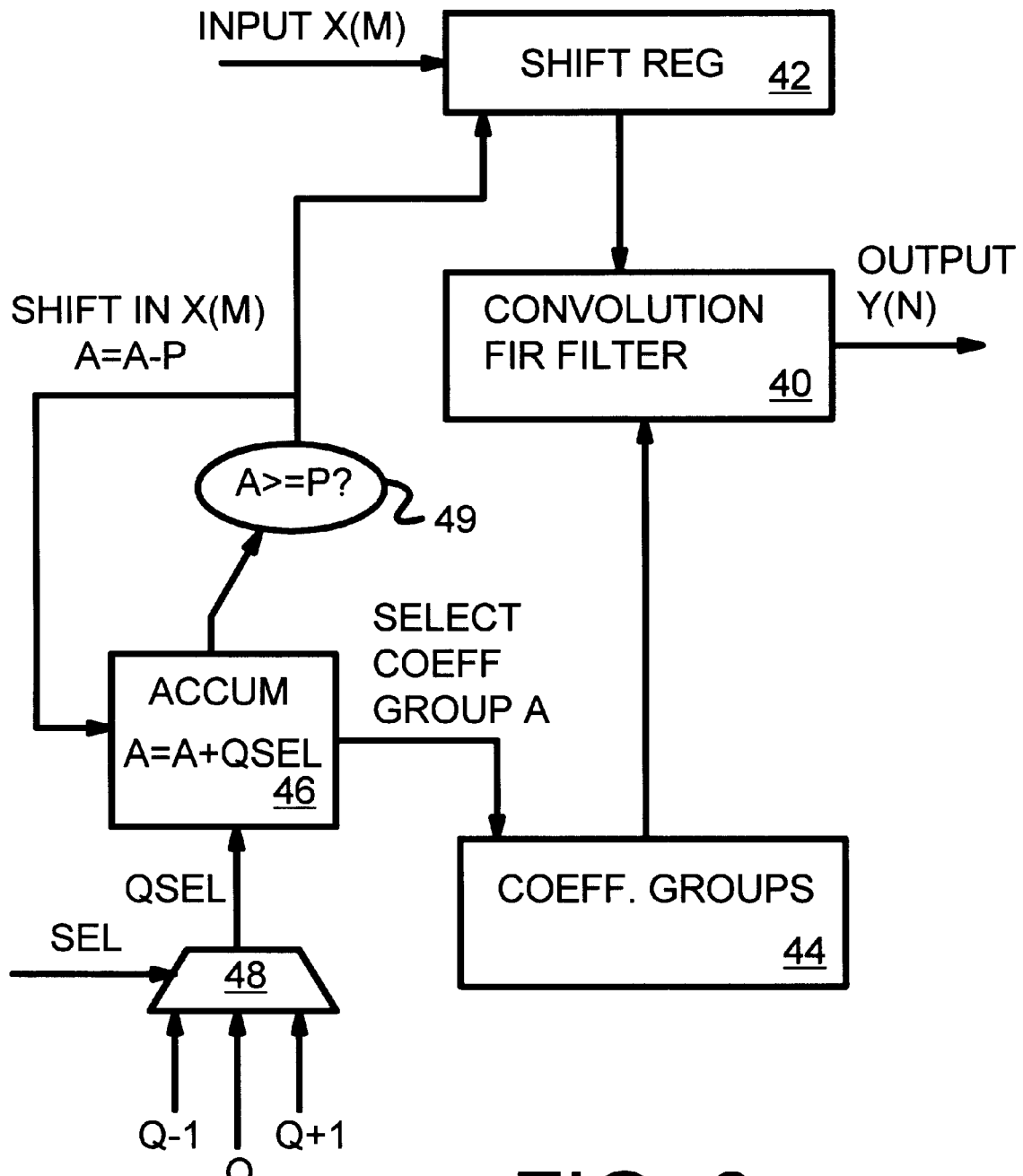
FIG. 6 shows in more detail a SRC filter that operates at three sampling ratios.

3-Ratio SRC Filter—FIG. 6

FIG. 6 shows in more detail a SRC filter that operates at three sampling ratios. Input samples from the FIFO are shifted in series into shift register 42 in response to a clock from comparator 49. Comparator 49 generates a clock pulse each time accumulator 46 reaches or exceeds a multiple of P. The accumulated value A in accumulator 46 is then reduced by P when the pulse is generated by comparator 49.

Accumulator 46 is increased by Q, Q+1, or Q−1 for each pulse of the output clock operating at output frequency f1. The comparator 28 of FIG. 5 compares the read and write counters to generate a select signal SEL to indicate which of Q, Q+1, and Q−1 should be selected by multiplexer 48 as QSEL, the amount to increase A in accumulator 46. When the write counter is ahead of the target, reading is accelerated by selecting Q+1. When the write counter is behind the target, reading is slowed by selecting Q−1. Q is selected when the write counter is on target, exactly two locations ahead of the read pointer.

Accumulator 46 thus increases A by Q, Q+1, or Q−1 for each output-clock pulse, while comparator 49 decreases A by P for each pulse of the derived clock (frequency f2) that reads the FIFO.

The value of the accumulator output A is used to select a group of coefficients from the set stored in coefficient storage 44. The selected set of P coefficients is sent to convolution filter 40, and multiplied by the input samples stored in shift register 42 and summed to produce one output sample y(i). Convolution filter 40 is a finite-impulse-response (FIR) filter that can be implemented by a software or firmware routine executing on a digital-signal processor (DSP) block. Alternately, convolution filter 40 can be a dedicated hardware filter.

Coefficient storage 44 is loaded with one set of coefficients. Different conversions, such as 8 KHz to 11.025 KHz or 24 KHz to 44.1 KHz, may each require a different set of coefficients. Each coefficient set is divided into P groups. Only one of these P groups is applied to convolution filter 40 for any one output-clock period. As accumulator 46 is adjusted by the output clock, a different one of the P groups of coefficients is selected by the accumulator value A. Thus a different group of the coefficients is used for each output sample generated b convolution filter 40. Of course, the coefficient groups are re-used for long audio streams, as the current value of A returns to an earlier A value.

Each of the P groups contains L coefficients, where L is the number of stages in shift register 42. L is also the number of samples filtered together by convolution filter 40 for each output sample generated. Larger values of L require more hardware and computations, but produce smoother results. Each set contains a total of L*P coefficients. In one embodiment, L is 16, and P is 640 for conversion to 48 KHz, so the total number of coefficients is 10,240.

Each of the coefficients is an impulse response of a low-pass filter with a cutoff frequency of $\omega=\pi/P$. Various sets of coefficients for different sampling ratio conversions are generated earlier and saved on a disk or in main memory, to be loaded into coefficient storage 44 when an audio conversion is performed. During the audio conversion the set of coefficients in coefficient storage 44 is not usually changed.
Q and P Values—FIG. 7

FIG. 7 is a table of values for Q and P for typical audio-rate conversions. Input sampling rates f0 from 11.025 KHz to 48 KHz are converted to a standard 48 KHz rate. When the input samples are synchronized to an independent 48-KHz clock, both Q and P are set to 624. The invention can then adjust the samples for differences in the two 48 KHz clocks of up to 1000 ppm by adjusting the ratio from 624/624 to 625/624 or 623/624.

Values for P are 640 or 624, while values of Q range from 104 to 624. Large values of P and Q allow for more accurate conversion and filtering.
Convolution Filter—FIG. 8

Figure 8:
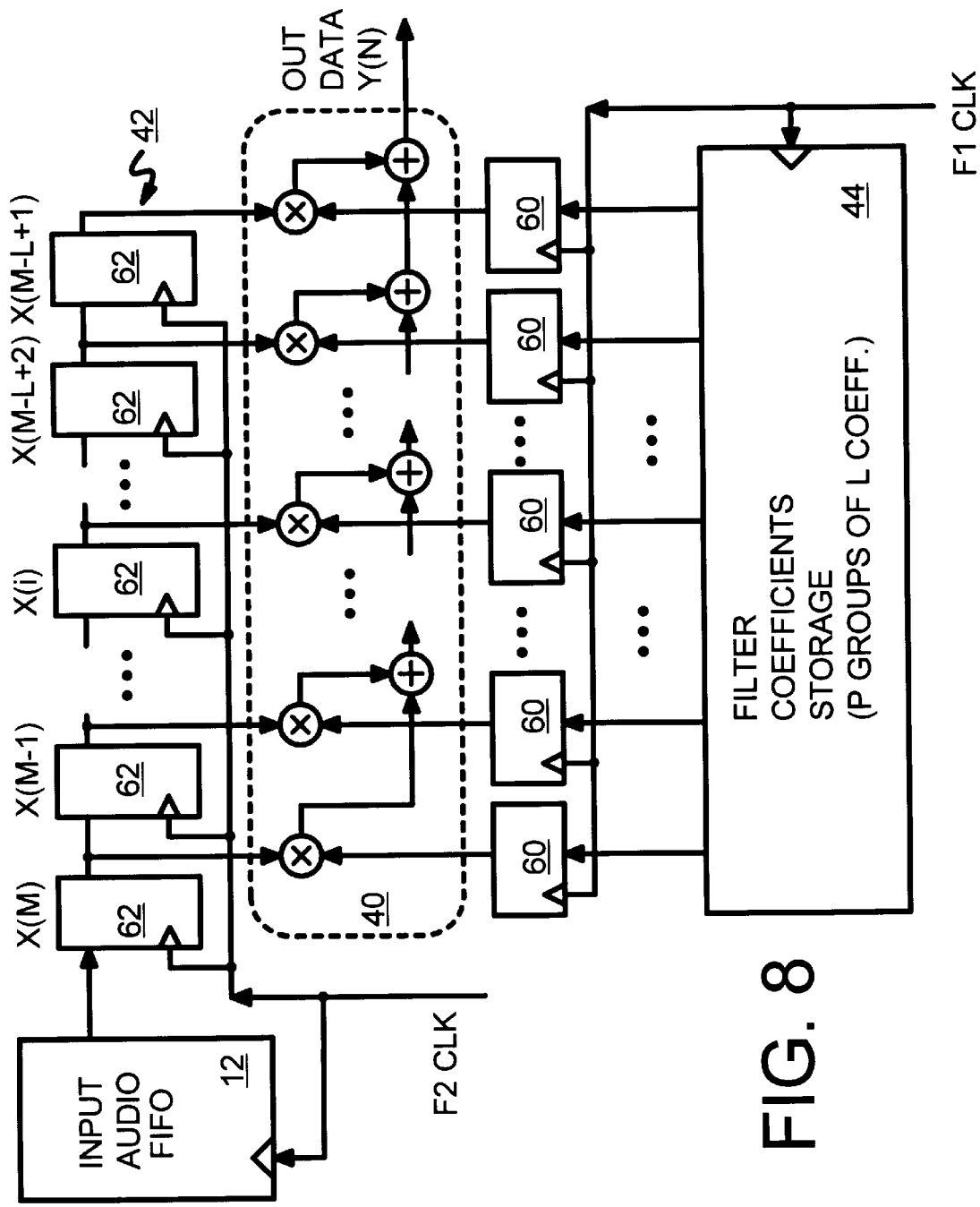
FIG. 8 is a diagram of a convolution filter used for sample-rate conversion.

FIG. 8 is a diagram of a convolution filter used for sample-rate conversion. Convolution filter 40 of FIG. 6 is implemented as a DSP engine that multiplies or scales each sample in shift register 42 by a coefficient from coefficient storage 44. The scaled samples are then summed by the DSP implementing convolution filter 40 to output sample y(i). A different output sample y(i) is generated for each pulse of the output clock F1 CLK.

The output clock F1 clock also shifts a new group of coefficient from coefficient storage 44 to staging registers 60 for use in generating the current output sample y(i). The derived clock F2 clock is applied to the read-clock control input of FIFO 12 and to each flip-flop 62 in shift register 42 so that each sample read from FIFO 12 is shifted down the chain of flip-flops 62. Since there are L flip-flops 62 for the L-tap filter, L input samples are used for generating one output sample. Each group of coefficients includes L coefficients that are loaded into L staging registers 60.

ADVANTAGES OF THE INVENTION

A digital sample-rate converter converts common PC-audio sampling rates. Digital-audio samples are buffered by a FIFO. The digital-audio samples are synchronized to independent clocks that may vary slightly in frequency. The digital sample-rate converter eliminates audible clicks and pops caused by slight mismatches of sampling rates. The sample-rate converter requires reduced coefficient storage since only one set needs to be loaded. High audio quality is produced even when samples from independent, asynchronous crystal oscillators are used.

The invention eliminates the need for a costly high-speed phase detector. The sample-rate converter can easily be integrated on a larger system chip since the sample-rate converter is all digital. Not using a high-frequency phase detector also eliminates a high-speed clock that is perhaps 1000 times the audio sample rates. Removing the high-speed clock reduces power consumption and noise.

ALTERNATE EMBODIMENTS

Several other embodiments are contemplated by the inventor. For example the input audio could be a serial bit stream. Then a serial-to-parallel converter is used. Binary counters with a modulo equal to the size of the FIFO are normally used for the read and write counters, but other kinds of counters may be substituted. Other arrangements for the comparators and module counters are possible. These may also be implemented in the DSP's firmware. While the values for Q, and P are thought to be optimized values, other values are possible which still reduce the coefficient storage requirements, although perhaps not as significantly.

The DSP can be a simplified DSP core or a more complex general-purpose DSP. The functions of the DSP can be reduced to hardware logic gates, either performing the multiplication and addition operations serially or in parallel. The audio sample-rate converter can be integrated into an audio controller integrated circuit chip, or as part of a larger system chip such as an integrated multimedia controller which includes a graphics controller. The sample-rate converter can also be integrated with an audio A/D or D/A converter.

The target difference between the write and read counters can be other values besides 2, such as half or quarter the FIFO size. The target can also be a range of values, such as 2–4. Rather than using two counters and a comparator, a single up-down counter could be used that is incremented by each write and decremented by each read. The FIFO could follow the convolution filter rather than precede it by making some modifications. The FIFO is written by the derived clock from the accumulator in the filter while the FIFO is read by the output clock. The derived clock is derived from the input clock in this alternate embodiment. Rather than using an accumulator to generate the derived clock, other clock generators such as counters, dividers, multipliers, and PLLs can be used. The accumulator could also be implemented as a firmware or software routine in a DSP or a general-purpose processor.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A sample-rate converter comprising:

an input stream of samples representing audio intensities at points in time, the input stream for playing the samples at an input rate of an input clock;

an output stream of samples representing audio intensities at points in time, the output stream for playing the samples at an output rate of an output clock;

a buffer for receiving the samples from the input stream in response to the input clock;

a derived-clock generator, coupled to the output clock, for generating a derived clock from the output clock;

a filter stage, coupled to receive samples from the buffer in response to a derived clock, for converting samples read from the buffer at a derived rate of the derived clock to output samples output at the output rate; and a target indicator, coupled to the input clock and coupled to the derived clock, for indicting when the buffer contains a target number of samples, and for indicating when the buffer contains less than the target or more than the target number of samples;

wherein the derived-clock generator generates the derived clock having a nominal frequency when the target indicator indicates that the buffer contains the target number of samples, but the derived-clock generator generating the derived clock with an accelerated frequency when the target indicator indicates that the buffer contains more than the target number of samples, the derived-clock generator generating the derived clock with a slowed frequency when the target indicator indicates that the buffer contains less than the target number of samples, whereby the derived clock that reads the buffer is accelerated and slowed in response to a number of samples stored in the buffer.

2. The sample-rate converter of claim 1 wherein the buffer is a first-in-first-out FIFO.

3. The sample-rate converter of claim 2 wherein a conversion ratio of the input rate to the output rate is represented by Q/P, where Q and P are mutually-prime integers not having a common multiple when the input rate substantially differs from the output rate;

wherein the nominal frequency is Q/P times the output rate;

wherein the accelerated frequency is (Q+x)/P times the output rate and the slowed frequency is (Q−x)/P times the output rate, where x is a small whole number while Q is a whole number greater than 100, whereby the conversion ratio is altered by the derived-clock generator to adjust sampling conversion.

4. The sample-rate converter of claim 3 wherein the target indicator comprises:

a write counter, coupled to the input clock, for indicating a write modulo of a number of samples written to the FIFO;

a read counter, coupled to the derived clock, for indicating a read modulo of a number of samples read from the FIFO; and a comparator for comparing a difference of the write modulo to the read modulo to the target number of samples, the comparator outputting an indication of when the FIFO contains a target number of samples, when the FIFO contains less than the target or more than the target number of samples, whereby read and write counters are compared to adjust the conversion ratio.

5. The sample-rate converter of claim 3 wherein the derived-clock generator comprises:

an accumulator, the accumulator increasing an accumulator value by a selected factor for each pulse of the output clock, the accumulator decreasing the accumulator value by P for each pulse of the derived clock when the accumulator value reaches or exceeds P;

wherein the selected factor is Q when the target indicator indicates that the FIFO contains the target number of samples;

wherein the selected factor is Q+x when the target indicator indicates that the FIFO contains more than the target number of samples;

wherein the selected factor is Q−x when the target indicator indicates that the FIFO contains less than the target number of samples;

whereby the accumulator generates the derived clock by adjusting the selected factor that increases the accumulator value from Q to Q+x or Q−x.

6. The sample-rate converter of claim 5 wherein x is 1 and Q is greater than 100 and P is between 600 and 700 for audio conversion to 48 KHz.

7. The sample-rate converter of claim 5 wherein the filter stage further comprises:

a shift register, responsive to the derived clock and coupled to receive samples read from the FIFO, for storing a plurality of L samples;

a finite-impulse-response (FIR) filter, coupled to receive the plurality of L samples from the shift register, for generating an output sample for each pulse of the output clock by scaling each of the plurality of L samples by L coefficients to produce scaled samples, and summing the scaled samples to generate the output sample;

coefficient storage, coupled to supply the L coefficients to the FIR filter, the coefficient storage storing P groups of L coefficients, whereby the plurality of L input samples from the FIFO are filtered to generate each output sample.

8. The sample-rate converter of claim 7 wherein the coefficient storage is further controlled by the accumulator value from the accumulator, the accumulator value identifying one of the P groups of L coefficients to be applied to the FIR filter to generate an output sample, whereby the accumulator value selects a group of coefficients for the FIR filter.

9. The sample-rate converter of claim 7 wherein the FIR filter is a routine executed by a digital-signal processor (DSP) or a general-purpose processor.

10. The sample-rate converter of claim 3 wherein when the input rate and the output rate are about equal, but the input clock is generated by a different crystal oscillator than the output clock so that the input clock and output clock are asynchronous, the sample-rate converter converts the input stream to the output stream without duplicating or deleting samples from the input stream, whereby audible click and pop distortion is reduced.

11. The sample-rate converter of claim 3 wherein when the input rate and the output rate are about equal, but the input clock is generated by a different crystal oscillator than the output clock so that the input clock and output clock are asynchronous, Q and P are equal, wherein Q is a large integer exceeding 100.

12. The sample-rate converter of claim 3 wherein Q is 588 and P is 640 when the input rate is nominally 44.100 KHz and the output rate is nominally 48 KHz.

13. A computer-implemented method for converting sample rates, the method comprising:

receiving an input clock at an input rate and writing an input sample to a FIFO for each pulse of the input clock;

receiving an output clock at an output rate and generating an output sample for each pulse of the output clock;

generating from the output clock a derived clock having a derived rate, the derived rate being a varying rate that varies among a nominal rate, an accelerated rate, and a slowed rate;

when the FIFO contains a target number of samples, generating the derived clock at the nominal rate;

when the FIFO contains more than the target number of samples, generating the derived clock at the accelerated rate;

when the FIFO contains less than the target number of samples, generating the derived clock at the slowed rate;

reading a sample from the FIFO for each pulse of the derived clock;

clocking the samples read from the FIFO sequentially through a chain of L registers with each pulse of the derived clock;

reading a group of L filter coefficients from a memory and multiplying each filter coefficient by one of the L registers to produce L results for each pulse of the output clock; and summing the L results to produce an output sample for each pulse of the output clock, whereby the input samples are sample-rate converted to the output samples at an adjustable rate by varying a rate of the derived clock in response to a FIFO target.

14. The computer-implemented method of claim 13 wherein generating the derived clock comprises:

dividing the output clock by P and multiplying by a selected factor, the selected factor being Q when the FIFO contains the target number of samples to generate the nominal rate, the selected factor being Q+1 when the FIFO contains more than the target number of samples to generate the accelerated rate, the selected factor being Q−1 when the FIFO contains less than the target number of samples to generate the slowed rate, whereby the FIFO is read more slowly by slowing the derived clock to (Q−1)/P times the rate of the output clock when the FIFO contains less than the target number of samples.

15. The computer-implemented method of claim 13 wherein generating the derived clock comprises:

decreasing an accumulated value by P when the accumulated value reaches P;

increasing the accumulated value by Q when the FIFO contains the target number of samples;

increasing the accumulated value by Q+1 when the FIFO contains more than the target number of samples;

increasing the accumulated value by Q−1 when the FIFO contains less than the target number of samples; and pulsing the derived clock when the accumulated value is decreased by P, whereby the derived clock is generated at a rate that varies among Q/P, (Q+1)/P, and (Q−1)/P times the output rate of the output clock in response to a number of samples in the FIFO.

16. The computer-implemented method of claim 15 wherein increasing the accumulated value is synchronized to the output clock and decreasing the accumulated value is synchronized to the derived clock.

17. The computer-implemented method of claim 15 further comprising:

using the accumulated value to select a group of L filter coefficients from the memory for use in a current period of the output clock, the accumulated value identifying one of the groups of L filter coefficients from the memory, whereby filter coefficients are selected by the accumulated value.

18. A sampling-rate converter comprising:

an input clock for synchronizing input samples;

an output clock for synchronizing output samples;

a derived-clock generator for generating a derived clock from the input clock, the derived clock having a rate about equal to a rate of the output clock;

a digital converter, receiving the input samples in response to the input clock and outputting converted samples in response to the derived clock;

a FIFO, coupled to the digital converter, for receiving converted samples from the digital converter in response to the derived clock, and for outputting output samples in response to the output clock;

a FIFO-fill indicator, coupled to the output clock and coupled to the derived clock, for indicting when the FIFO contains a target number of samples, and for indicating when the FIFO contains less than the target or more than the target number of samples;

wherein the derived-clock generator generates the derived clock having a nominal frequency when the FIFO-fill indicator indicates that the FIFO contains the target number of samples, but the derived-clock generator generating the derived clock with an accelerated frequency when the FIFO-fill indicator indicates that the FIFO contains less than the target number of samples, the derived-clock generator generating the derived clock with a slowed frequency when the FIFO-fill indicator indicates that the FIFO contains more than the target number of samples, whereby the derived clock that reads the FIFO is accelerated and slowed in response to a number of samples stored in the FIFO.

19. The sampling-rate converter of claim 18 wherein the derived clock is asynchronous to the output clock.

20. The sampling-rate converter of claim 18 wherein the derived clock is generated by a different crystal oscillator than the output clock.

* * * * *